(12) United States Patent  
Sojka

(10) Patent No.: US 9,374,928 B2  
(45) Date of Patent: Jun. 21, 2016

(54) INTELLIGENT RACK ENCLOSURE

(75) Inventor: Matthew Sojka, Warwick, RI (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 154 days.

(21) Appl. No.: 14/361,793

(22) PCT Filed: Dec. 20, 2011

(86) PCT No.: PCT/US2011/065968
§ 371 (c)(1),
(2), (4) Date: May 30, 2014

(87) PCT Pub. No.: WO2013/095352
PCT Pub. Date: Jun. 27, 2013

(65) Prior Publication Data
US 2014/0292167 A1   Oct. 2, 2014

(51) Int. Cl.
*H05K 7/20* (2006.01)
*H05K 7/18* (2006.01)
*H05K 7/14* (2006.01)

(52) U.S. Cl.
CPC ............. *H05K 7/20* (2013.01); *H05K 7/1498* (2013.01); *H05K 7/186* (2013.01); *H05K 7/20736* (2013.01); *H05K 7/20836* (2013.01); *Y10T 29/49826* (2015.01)

(58) Field of Classification Search
CPC .................................. H05K 7/20; H05K 7/186
USPC .................................. 312/234, 223.1; 29/428
See application file for complete search history.

(56) References Cited

U.S. PATENT DOCUMENTS

| | | | |
|---|---|---|---|
| 5,410,448 A | 4/1995 | Barker, III et al. | |
| 6,745,149 B2 * | 6/2004 | Beeten | H05K 7/20136 312/223.1 |
| 6,747,874 B2 * | 6/2004 | McKinnon | H04Q 1/06 211/26 |
| 6,967,283 B2 | 11/2005 | Rasmussen et al. | |
| 7,377,125 B2 * | 5/2008 | Seiden | F25D 11/02 62/441 |
| 7,500,911 B2 * | 3/2009 | Johnson | H05K 7/20736 165/104.33 |
| 7,948,196 B2 | 5/2011 | Begun et al. | |
| 8,024,451 B2 | 9/2011 | Fowler et al. | |
| 2007/0081888 A1 | 4/2007 | Harrison | |
| 2007/0187343 A1 | 8/2007 | Colucci et al. | |
| 2008/0265722 A1 | 10/2008 | Saliaris | |
| 2009/0321039 A1 | 12/2009 | Therrien et al. | |

(Continued)

FOREIGN PATENT DOCUMENTS

WO    2015157999 A1   10/2015

OTHER PUBLICATIONS

Extended European Search Report from corresponding European Application No. EP 11877941.2 dated Jul. 15, 2015.

(Continued)

*Primary Examiner* — Jeremy C Norris
*Assistant Examiner* — Nathan Milakovich
(74) *Attorney, Agent, or Firm* — Lando & Anastasi, LLP

(57) ABSTRACT

An equipment enclosure includes a housing defining an interior compartment divided into a first region dimensioned to contain an equipment rack and a second region disposed outside of the first region and bounded by the first region and the housing; and a controller configured to monitor at least one operating parameter of the equipment enclosure and wholly disposed in the second region of the interior compartment.

20 Claims, 3 Drawing Sheets

(56) References Cited

U.S. PATENT DOCUMENTS

| | | |
|---|---|---|
| 2010/0110633 A1 | 5/2010 | Gigushinsky |
| 2010/0139908 A1 | 6/2010 | Slessman |
| 2011/0077797 A1* | 3/2011 | Mehrotra ........... G05D 23/1917 700/300 |
| 2011/0216503 A1 | 9/2011 | Ramodien |
| 2012/0003912 A1* | 1/2012 | Hoover .............. H05K 7/20727 454/184 |
| 2013/0031399 A1 | 1/2013 | Watson |
| 2013/0127313 A1* | 5/2013 | Schrader .............. H05K 7/2019 312/236 |
| 2014/0026762 A1* | 1/2014 | Riefenstein .......... H05B 6/6441 99/325 |
| 2014/0195066 A1* | 7/2014 | Nanda ..................... G06F 1/206 700/300 |
| 2015/0076976 A1* | 3/2015 | Bailey .................... H05K 5/023 312/223.6 |
| 2015/0105930 A1* | 4/2015 | Sparrowhawk ........ G01R 11/04 700/297 |
| 2015/0206373 A1* | 7/2015 | Kim .......................... G06F 9/10 221/1 |

OTHER PUBLICATIONS

Notification of Transmittal of the International Search Report and the Written Opinion of the International Searching Authority from corresponding PCT/US2011/065968 dated Apr. 24, 2012.

* cited by examiner

INTELLIGENT RACK ENCLOSURE

This application is a U.S. National Stage Application under 35 U.S.C. 0371 from International Application No. PCT/US2011/065968, filed Dec. 20, 2011, which is hereby incorporated by reference in its entirety for all purposes.

BACKGROUND

1. Field of Invention

Embodiments of the invention relate generally to enclosures for use with rack-mountable appliances and equipment.

2. Discussion of Related Art

The uses, requirements, size and complexity of information technology (IT) operations continue to increase dramatically in response to the demands of information-based economies. The critical importance of IT operations to many organizations brings the recognition that IT resources must be managed in a manner that ensures their integrity and functionality. These resources comprise various assets, including computer systems, network and telecommunications equipment, power supplies, environmental controls and security devices, to name a few typical examples. To meet the needs of the organization, system administrators must be able to readily monitor each asset within the group of collective resources for the safe, nominal and efficient operation of the data center.

Traditionally many of these assets are centrally located in one or more data centers, enabling centralized control and monitoring, although these assets may also be remotely located and interconnected via a communications network. Individual assets can be installed in electrical enclosures, which are cabinets for housing electrical or electronic equipment and cabling. Although assets within each enclosure may be monitored by installing multiple pieces of monitoring equipment throughout portions of the rack designed to contain the assets, this technique consumes valuable usable space that could otherwise be used for other IT assets.

SUMMARY

According to one embodiment, an equipment enclosure includes a housing defining an interior compartment divided into a first region dimensioned to contain an equipment rack and a second region disposed outside of the first region and bounded by the first region and the housing, and a controller configured to monitor at least one operating parameter of the equipment enclosure and wholly disposed in the second region of the interior compartment.

In one embodiment, the equipment enclosure may include at least one sensor disposed in the interior compartment and configured to detect the at least one operating parameter of the equipment enclosure. In another embodiment, the at least one sensor may be wholly disposed in the second region of the interior compartment. In yet another embodiment, the controller may be operatively coupled to the at least one sensor. In yet another embodiment, the at least one operating parameter may include a temperature of the interior compartment and/or a humidity of the interior compartment. In yet another embodiment, the at least one operating parameter may include a plurality of operating parameters each corresponding to different portions of the interior compartment.

In one embodiment, the equipment enclosure may include at least one indicator operatively coupled to the controller and configured to display an indication representative of the at least one operating parameter. In another embodiment, the at least one indicator may include a multi-colored indicator. In yet another embodiment, the equipment enclosure may include a user display mounted to an exterior surface of the housing. The user display may include the at least one indicator. In yet another embodiment, the equipment enclosure may include at least one equipment mounting rail coupled to the housing. The at least one indicator may be disposed on the at least one equipment mounting rail.

In one embodiment, the equipment enclosure may include a power distribution unit (PDU) disposed in the housing. The controller may be configured to monitor power in the PDU. In another embodiment, the controller may be further configured to be operatively coupled to a communication network for communicating monitoring information to a networked device.

In one embodiment, the equipment enclosure may include at least one wire raceway coupled to the housing within the second region of the interior compartment. The at least one wire raceway may be configured to contain at least one wire to be connected to the controller.

According to one embodiment, an equipment enclosure includes a housing defining an interior compartment divided into a first region dimensioned to contain an equipment rack and a second region disposed outside of the first region and bounded by the first region and the housing, and means disposed in the second region for monitoring at least one operating parameter of the interior compartment and providing an indication to a user of a status of the at least one operating parameter.

According to one embodiment, an equipment enclosure includes a housing defining an interior compartment divided into a first region dimensioned to contain an equipment rack and a second region disposed outside of the first region and bounded by the first region and the housing. A method of assembling the equipment enclosure includes mounting a controller to the housing such that the controller is wholly disposed in the second region of the interior compartment, and mounting at least one sensor in the interior compartment. The at least one sensor is operably coupled to the controller and configured to detect at least one operating parameter of the equipment enclosure.

In one embodiment, the method may include coupling at least one indicator to the controller. The at least one indicator may be configured to display an indication representative of the at least one operating parameter. In another embodiment, the method may include coupling at least one equipment mounting rail to the housing, and mounting the at least one indicator to the at least one equipment mounting rail. In yet another embodiment, the method may include coupling the at least one indicator to an exterior portion of the housing.

In one embodiment, the housing may include at least one wire raceway. The method may include installing, in the at least one wire raceway, at least one wire to be connected to the at least one sensor. In another embodiment, the method may include mounting a plurality of sensors in different portions of the interior compartment.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
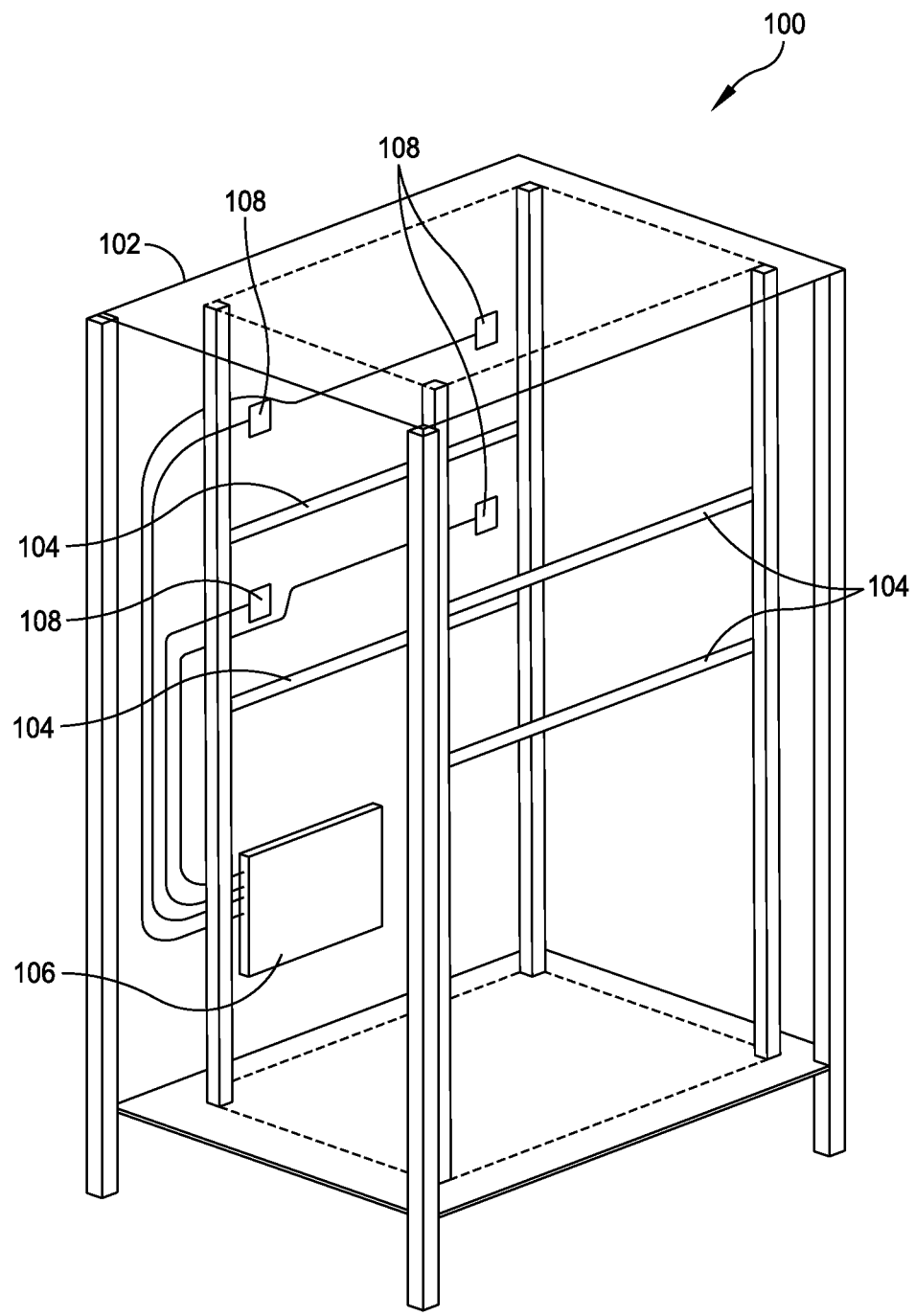
FIG. 1 is a perspective view of an equipment enclosure in accordance with one embodiment.

According to one aspect, an equipment enclosure, which has an interior compartment, includes an integrated appliance for monitoring one or more operating parameters of the equipment enclosure and/or any equipment mounted within the interior compartment. Such operating parameters may include, for example, power status (e.g., power distribution, availability or consumption), environment (e.g., temperature and/or humidity within the equipment enclosure or of the equipment mounted therein), and/or security (e.g., door lock, user access, etc.). Further, one or more sensors may also be integrated into the equipment enclosure for detecting any of the operating parameters. For example, temperature and humidity sensors may be mounted within the equipment enclosure at strategic locations for detecting the temperature and humidity at various points within the interior compartment. In another example, the sensors may be factory-installed in predetermined locations that conform to, for example, a design specification or customer request. The integrated appliance and/or the sensors can, in one embodiment, be located in the otherwise unused space of the interior compartment. Embodiments of this invention are not limited in their application to the details of construction and the arrangement of components set forth in the following description or as illustrated in the drawings. Embodiments of the invention are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

As used herein, the term "enclosure" describes a structure which either partially or completely encloses one or more appliances and/or other pieces of equipment (e.g., rack-mountable equipment).

In many data center environments, IT assets are installed in standardized equipment enclosures, for example as defined by the EIA-310 specification. A large data center may have hundreds of equipment enclosures. An IT asset may comprise one or more pieces of equipment, such as servers, network routers, data storage devices, and the like. Equipment designed for installation in an enclosure is typically described as "rack mountable" and usually has a standard width, for example 19 or 23 inches, which is compatible with the width of the rack. Such equipment is also often designed to have a standard height measured in multiples of one rack unit or "U," which is typically 1.75 inches. Accordingly, the size of a piece of rack mounted equipment having a height of one rack unit is described as "1U"; two rack units as "2U," etc.

Typically, conventional equipment enclosures have simple designs for performing a single task, such as housing equipment, and provide few, if any, additional features. There are several conventional hardware solutions available for monitoring the environment, power and security of the equipment enclosures and the equipment installed inside the enclosures. However, as discussed above, these conventional monitoring solutions, when installed, typically consume valuable rack space that could otherwise be used for other IT assets (e.g., servers, network switches, cooling units, power distribution units, uninterruptible power supplies, etc.). Some conventional monitoring solutions may also require additional power, cabling and cooling when installed. Furthermore, some conventional monitoring solutions are typically manufactured and sold separately from equipment enclosures, imposing additional acquisition and installation expense by the customer.

According to one aspect, it is appreciated that some equipment enclosures, even when fully utilized, contain some vacant space inside the cabinet. Thus, some embodiments are directed to systems and methods for monitoring operating parameters of the equipment enclosure and/or pieces of equipment mounted therein by locating a monitoring appliance and various sensors in the vacant spaces of the equipment enclosure.

In one embodiment, the monitoring appliance and sensors are integrated into the equipment enclosure, for example, by mounting the appliance and/or sensors in the vacant space during or after assembly of the enclosure. Such integration may also include, for example, installing cabling associated with the monitoring appliance and/or sensors in wire raceways or other hollow spaces of the cabinet to save space, and consolidating most or all monitoring functions into a single network-addressable monitoring appliance. Some benefits of this and other embodiments include increasing the amount of space that can be used for other assets, retaining the maximum amount of "U" space available for installing assets in the cabinet, reducing the need to install additional monitoring equipment, maximizing the space available for cabling and airflow, protecting integrated wiring from potential damage due to installation or removal of equipment, reducing the number of network addresses used for each cabinet, and reducing complexity, power consumption, and acquisition and operational costs.

In another embodiment, visible and/or audible indicators for indicating the status of the operating parameters, such as light emitting diodes (LEDs) or buzzers, can be integrated into or disposed on various structural elements of the equipment enclosure. Such structural elements include, for example, equipment mounting rails, panels and doors, and the indicators can be installed such that the indicators do not consume valuable space in the cabinet, but still provide IT personnel with local indications of the "health" of the cabinet and equipment.

FIG. 1 is a perspective view of an equipment enclosure 100, according to one embodiment. The equipment enclosure 100 is substantially formed by a housing 102, which may include side, top and bottom panels, as will be understood by one of skill in the art. Some side panels and the top panel of the housing 102 are not shown so that other elements of the enclosure are visible. The housing 102 defines an interior compartment in which mounting rails 104 can be installed for mounting various pieces of equipment (not shown). The mounting rails 104 may be, for example, part of a conventional rack mounting system. A controller 106 can be mounted to the housing 102 or an internal support structure (not shown). A plurality of sensors 108 can be mounted in the interior compartment at various locations, such as along the sides, top, and/or bottom of the housing 102. Further, the sensors 108 can be variously located toward the front, rear, left, right, upper and/or lower portions of the equipment enclosure 100. The sensors 108 may be operatively coupled to the controller 106 using either wired or wireless connections. As will be described below, the controller 106 and the sensors 108 may, for example, be located in regions of the interior compartment that are not designated for holding rack-mountable equipment (e.g., "no-U" space).

Figure 2:
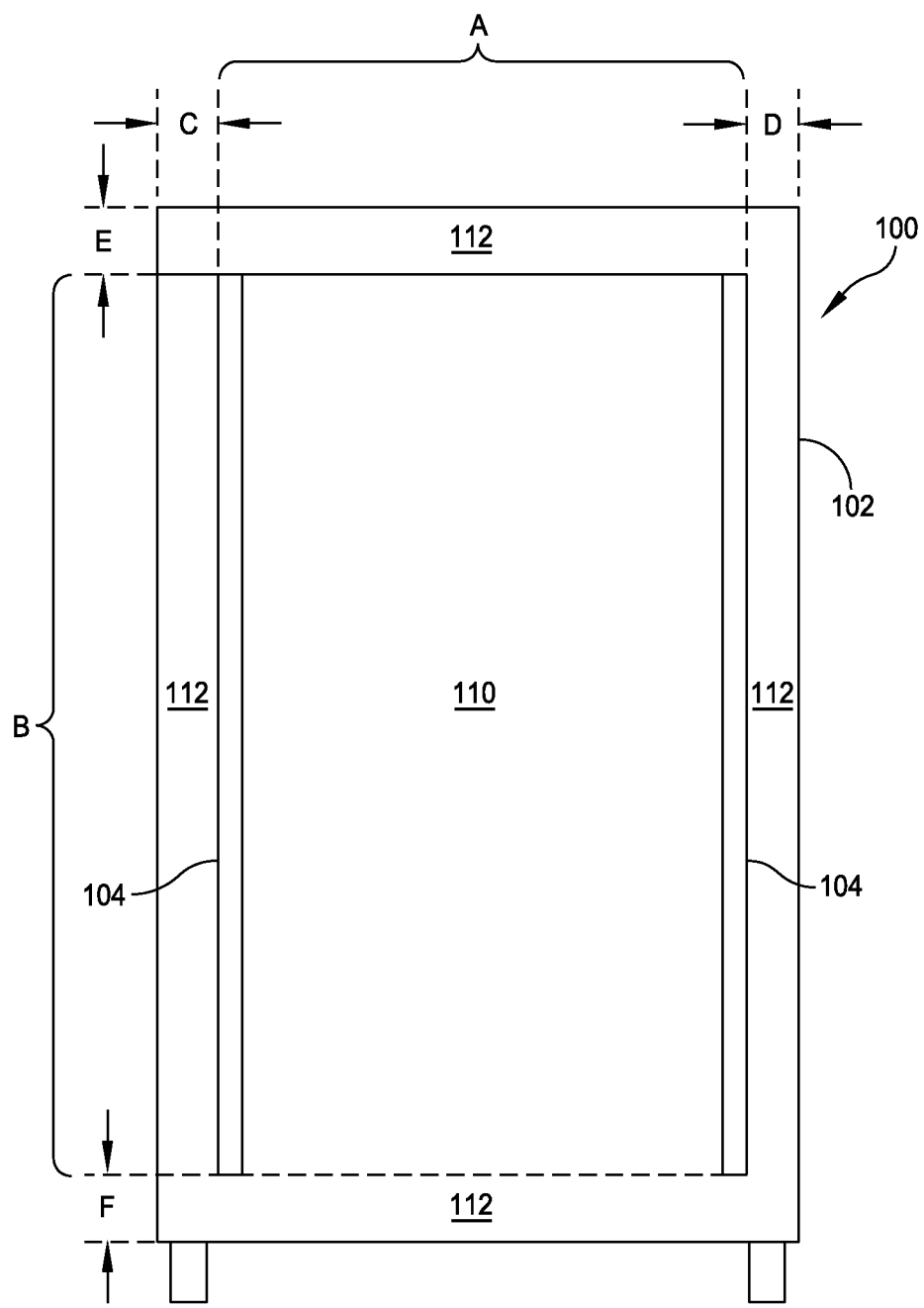
FIG. 2 is a front view of the equipment enclosure of FIG. 1.

FIG. 2 is a front view of the equipment enclosure 100 shown in FIG. 1. The space within the interior compartment can include several distinct regions. The regions are not necessarily physically partitioned from one another, although some physical structures or elements in the equipment enclosure 100 may serve as demarcation points between adjacent regions. A first region 110 includes substantially all of the space within the interior compartment that can be allocated for mounting equipment. For example, the first region 110 may be bounded on the sides by the mounting rails 104 and at the top and bottom by the extent of the rails in the area substantially corresponding to width A and height B. The first region 110 may also be bounded front to back (not shown) to include a volume. The first region 110 may be used, for example, as "U" space for mounting one or more pieces of equipment, or designated for such use (e.g., such as setting aside "U" space for future expansion).

The interior compartment also includes a second region 112 adjacent to the first region 110. The second region 112 may include, for example, space between the mounting rails 104 and the housing 102 (i.e., along the sides of the equipment enclosure 100), and/or the space above or below the mounting rails 104 (sometimes referred to as the "ceiling" or "basement"). In FIG. 2, the second region 112 may include, for example, any of the areas designated by dimensions C, D, E and/or F. The second region 112 may include other areas not shown in FIG. 2, such as space that is typically unused in conventional enclosure applications. The second region 112 is sometimes referred to as "no-U" space because it may not, in some embodiments, be configured in a size or shape to accommodate standard size equipment racks or rack-mountable equipment. While the second region 112 may, for example, be used at least partially for airflow (cooling) and/or cable management, in some embodiments a significant amount of space within the second region 112 can be employed for other purposes, including locating the controller 106 and at least some of the sensors 108, such as shown in FIG. 1.

Figure 3:
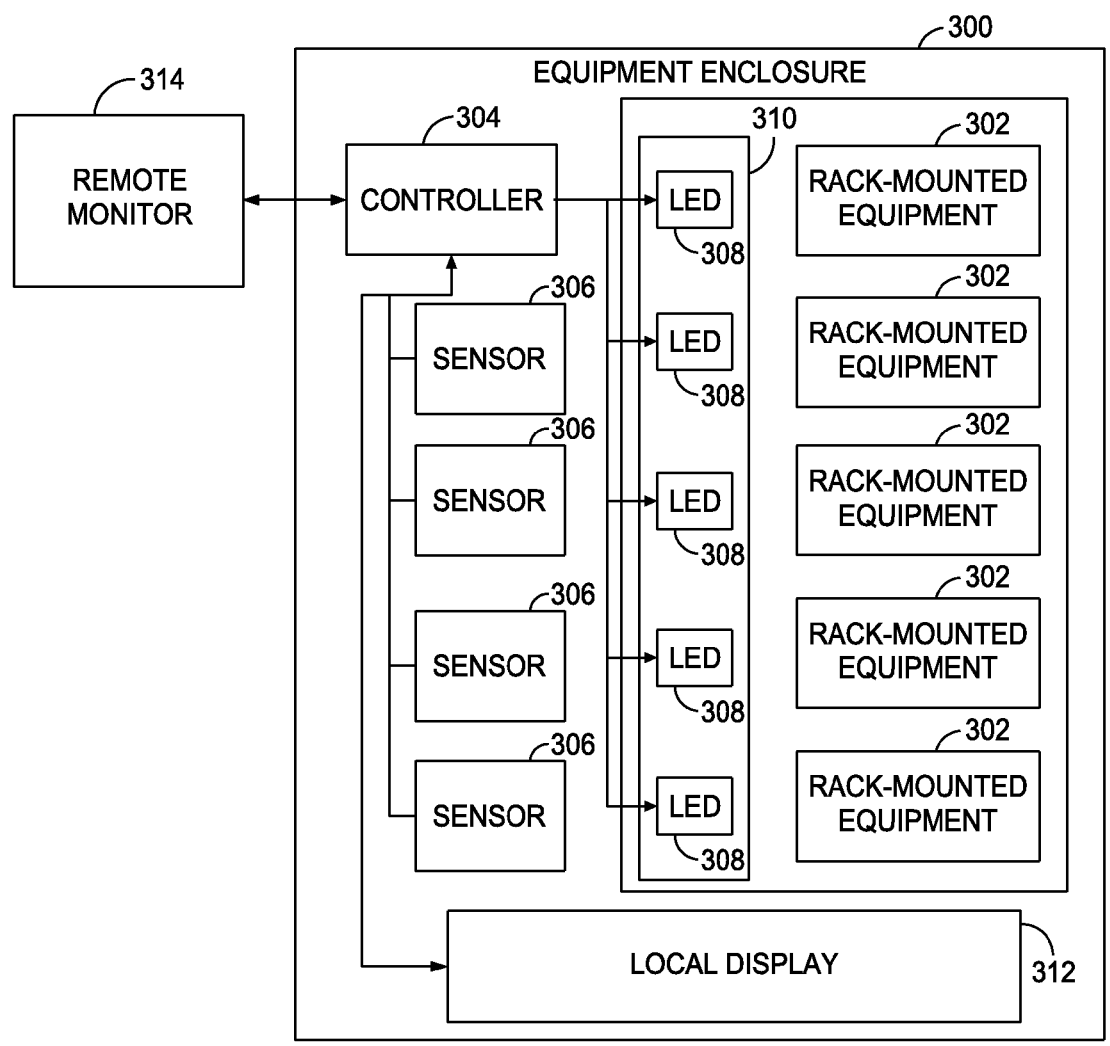
FIG. 3 is a block diagram of an equipment enclosure in accordance with one embodiment.

FIG. 3 is a block diagram of an equipment enclosure 300, according to one embodiment. The equipment enclosure 300 may incorporate many conventional design features of a standardized enclosure, as will be understood by one of skill in the art. For example, as described above, the equipment enclosure 300 can conform to the EIA-310 specification to accommodate rack-mounting one or more pieces of equipment 302.

The equipment enclosure 300 includes a controller 304, such as the controller 106 described above with respect to FIGS. 1 and 2. The equipment enclosure 300 may optionally include one or more sensors 306 mounted at various locations within the equipment enclosure 300 and operatively coupled (e.g., wired or wirelessly) to the controller 304. The equipment enclosure may optionally include a local display 312 or other type of local user interface.

As discussed above, the controller 304 and/or the sensors 306 may, for example, be located in the "no-U" space of the equipment enclosure 300. The equipment enclosure 300 may also optionally include one or more indicators, such as LED 308 shown in FIG. 3. The LED 308, in one embodiment, includes a multi-colored LED or a group of different colored LEDs. Each LED 308 may, as discussed in one example above, be mounted on a mounting rail 310 (e.g., in one of the existing mounting holes of the rail).

In addition to, or alternatively, the LEDs 308 can optionally be mounted in an exterior panel or door of the equipment enclosure 300, for example, as part of a user interface panel or the local display 312. The local display 312 may include indicators and/or other operator interface components for monitoring or managing the operation of the equipment enclosure 300 (e.g., power, cooling, humidity, and security).

For example, the local display 312 may include a graphical user interface (GUI), touch screen, or other type of user interface. In one embodiment, the local display 312 is integrated into the design of the equipment enclosure 300 such that the local display 312 and/or the LEDs 308 are pre-installed at the factory or supplied with the equipment enclosure for on-site installation by the customer. The LEDs 308 and/or the local display 312 enables IT personnel to view specific sensor values, status information or other operating parameters of the equipment enclosure 300, and optionally for each piece of rack-mounted equipment within the equipment enclosure, while standing beside the equipment enclosure. For example, in the event of an alert notification, the local display 312 may show a grid representing the equipment enclosure and the "U" level of the equipment associated with the alert, as well as the cause (e.g., over temperature, power anomaly, etc.). The user may use the local display 312 to view the operating parameters as well as the alarms. It is further contemplated that the LEDs 308 and/or the local display 312 may, in some embodiments, reduce or eliminate the need to connect the controller 304 to a separate user interface for monitoring the operating parameters of the equipment enclosure.

As discussed above, the sensors 306 may be configured to detect temperature or humidity inside the equipment enclosure 300. In other embodiments, the sensors 306 may be configured to monitor security (e.g., cabinet doors and locks), power distribution inside the equipment enclosure 300, or other operating parameters of the equipment enclosure 300 and/or the equipment 302. The sensors 306 may be located at different locations within the equipment enclosure 300. For example, temperature and/or humidity sensors may be placed at each "U" level of the equipment enclosure 300 to detect the temperature/humidity near equipment mounted at each level. In another example, the temperature/humidity sensors may be placed near the front and rear of each "U" level to further distinguish temperature/humidity in different areas of the equipment enclosure 300.

In one embodiment, as discussed above, the controller 304 can be configured to monitor one or more operating parameters of the equipment enclosure 300, including power, environment and security. The equipment enclosure 300 may include, for example, a power distribution unit (PDU) (not shown) for providing power to the equipment mounted in the equipment enclosure. The PDU may include a switched rack PDU, such as Model Number AP7900 sold by American Power Conversion Corporation (APC). Such switched rack PDUs may provide, for example, load metering, remotely controlled on/off switching of individual outlets, delayed power sequencing of equipment and outlet use management, usually through a network interface with the controller 304 or a remote controller. The controller 304 can thus be configured to monitor and/or control the operation of the PDU. Status information for the PDU may, for example, be provided through the LEDs 308 and/or local display 312.

In another embodiment, the controller 304 is connected to a remote monitor 314 through a communication network. In one example, the remote monitor 314 may be an automated centralized data center configuration and control manager, such as InfraStruXure® Central Server, Model Number AP9475, also sold by APC, or a NetBotz appliance. In another example, the remote monitor 314 may include one or more devices, interconnected through a network, of a distributed processing system configured to manage IT assets. In one example, the controller 304 is assigned a network address such that the remote monitor 314 may access all monitoring and control functions of the controller 304 using a single network address, rather than different addresses for each integrated component of the equipment rack 300. In this sense, the entire equipment rack 300 may be considered a network-addressable component.

Embodiments of the present invention may be used with uninterruptible power sources having a variety of input and output voltages and may be used in single phase or multiphase applications.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the scope of the invention. For example, one embodiment of the equipment enclosure may be configured to permit installation of industry-standard equipment, with proper spacing within the equipment enclosure allocated for cable management and airflow. In another example, the controller may be accessed using a conventional communication network using a software or firmware-based graphical user interface (GUI). The GUI may be configured to enable a user to set or change sensor thresholds and/or alarm, warning or status notifications based on certain conditions, as well as to enable the user to monitor specific values of each sensor mounted in the equipment enclosure. Accordingly, the foregoing description and drawings are by way of example only.

What is claimed is:

1. An equipment enclosure, comprising:
a housing having a plurality of side panels defining an interior compartment divided into a first region dimensioned to contain an equipment rack and bounded on sides by a plurality of mounting rails, and a second region disposed between the plurality of side panels of the housing and the plurality of mounting rails of the first region, a width of the second region between the plurality of side panels and the plurality of mounting rails being less than a width of the first region between mounting rails; and
a controller configured to monitor at least one operating parameter of the equipment enclosure and wholly disposed in the second region of the interior compartment.

2. The equipment enclosure of claim 1, further comprising at least one sensor disposed in the interior compartment and configured to detect the at least one operating parameter of the equipment enclosure.

3. The equipment enclosure of claim 2, wherein the at least one sensor is wholly disposed in the second region of the interior compartment.

4. The equipment enclosure of claim 3, wherein the controller is operatively coupled to the at least one sensor.

5. The equipment enclosure of claim 4, wherein the at least one operating parameter includes at least one of a temperature of the interior compartment and a humidity of the interior compartment.

6. The equipment enclosure of claim 5, wherein the at least one operating parameter includes a plurality of operating parameters each corresponding to different portions of the interior compartment.

7. The equipment enclosure of claim 1, further comprising at least one indicator operatively coupled to the controller and configured to display an indication representative of the at least one operating parameter.

8. The equipment enclosure of claim 7, wherein the at least one indicator includes a multi-colored indicator.

9. The equipment enclosure of claim 7, further comprising a user display mounted to an exterior surface of the housing and including the at least one indicator.

10. The equipment enclosure of claim 7, wherein the at least one indicator is disposed on at least one of the plurality of mounting rails.

11. The equipment enclosure of claim 1, further comprising a power distribution unit (PDU) disposed in the housing, wherein the controller is configured to monitor power in the PDU.

12. The equipment enclosure of claim 1, wherein the controller is further configured to be operatively coupled to a communication network for communicating monitoring information to a networked device.

13. The equipment enclosure of claim 1, further comprising at least one wire raceway coupled to the housing and configured to contain at least one wire to be connected to the controller within the second region of the interior compartment.

14. An equipment enclosure, comprising:
a housing having a plurality of side panels defining an interior compartment divided into a first region dimensioned to contain an equipment rack and bounded on sides by a plurality of mounting rails, and a second region disposed between the plurality of side panels of the housing and the plurality of mounting rails of the first region, a width of the second region between the plurality of side panels and the plurality of mounting rails being less than a width of the first region between mounting rails; and
means disposed in the second region for monitoring at least one operating parameter of the interior compartment and providing an indication to a user of a status of the at least one operating parameter.

15. A method of assembling an equipment enclosure, the equipment enclosure including a housing having a plurality of side panels defining an interior compartment divided into a first region dimensioned to contain an equipment rack and bounded on sides by a plurality of mounting rails, and a second region disposed between the plurality of side panels of the housing and the plurality of mounting rails of the first region, a width of the second region between the plurality of side panels and the plurality of mounting rails being less than a width of the first region between mounting rails, the method comprising:
mounting a controller to the housing such that the controller is wholly disposed in the second region of the interior compartment; and
mounting at least one sensor in the interior compartment, the at least one sensor being operably coupled to the controller and configured to detect at least one operating parameter of the equipment enclosure.

16. The method of claim 15, further comprising coupling at least one indicator to the controller, the at least one indicator configured to display an indication representative of the at least one operating parameter.

17. The method of claim 16, further comprising mounting the at least one indicator to at least one of the plurality of mounting rails.

18. The method of claim 16, further comprising coupling the at least one indicator to an exterior portion of the housing.

19. The method of claim 15, wherein the housing includes at least one wire raceway, and wherein the method further comprises installing, in the at least one wire raceway, at least one wire to be connected to the at least one sensor.

20. The method of claim 15, further comprising mounting a plurality of sensors in different portions of the interior compartment.

\* \* \* \* \*